(12) United States Patent
Sugata

(10) Patent No.: US 11,985,869 B2
(45) Date of Patent: May 14, 2024

(54) DISPLAY DEVICE INCLUDING PROTECTION LAYER COVERING METAL LAYER IN TFT LAYER, METHOD FOR PRODUCING DISPLAY DEVICE, AND APPARATUS FOR PRODUCING DISPLAY DEVICE

(71) Applicant: SHARP KABUSHIKI KAISHA, Sakai (JP)

(72) Inventor: Masaru Sugata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 582 days.

(21) Appl. No.: 16/982,963

(22) PCT Filed: Mar. 23, 2018

(86) PCT No.: PCT/JP2018/011772
§ 371 (c)(1),
(2) Date: Sep. 21, 2020

(87) PCT Pub. No.: WO2019/180925
PCT Pub. Date: Sep. 26, 2019

(65) Prior Publication Data
US 2021/0020730 A1 Jan. 21, 2021

(51) Int. Cl.
*H10K 59/131* (2023.01)
*H10K 50/84* (2023.01)
*H10K 50/844* (2023.01)
*H10K 59/12* (2023.01)
*H10K 71/00* (2023.01)

(52) U.S. Cl.
CPC ......... *H10K 59/131* (2023.02); *H10K 50/841* (2023.02); *H10K 50/844* (2023.02); *H10K 71/00* (2023.02); *H10K 59/1201* (2023.02)

(58) Field of Classification Search
CPC .. H10K 59/131; H10K 59/1201; H10K 59/12; H10K 59/87; H10K 59/871; H10K 59/872; H10K 50/841; H10K 50/842; H10K 50/844; H10K 71/40; H10K 71/421; H10K 71/441
USPC .......................................................... 257/40
See application file for complete search history.

(56) References Cited

U.S. PATENT DOCUMENTS

| | | | |
|---|---|---|---|
| 2007/0002201 A1* | 1/2007 | You | G02F 1/1368 257/E27.111 |
| 2015/0091030 A1 | 4/2015 | Lee et al. | |
| 2016/0104858 A1* | 4/2016 | You | H10K 59/1213 257/40 |
| 2017/0033312 A1* | 2/2017 | Kim | H10K 50/844 |
| 2017/0139296 A1* | 5/2017 | Kimoto | G02F 1/136259 |
| 2017/0279071 A1 | 9/2017 | Tamekawa et al. | |

FOREIGN PATENT DOCUMENTS

| | | |
|---|---|---|
| JP | 2007-017972 A | 1/2007 |
| JP | 2009-069251 A | 4/2009 |
| JP | 2015-118982 A | 6/2015 |

(Continued)

*Primary Examiner* — Matthew E. Gordon
(74) *Attorney, Agent, or Firm* — ScienBiziP, P.C.

(57) ABSTRACT

A display device includes: a TFT layer including a metal layer and a protection layer protecting the metal layer in a layer above the metal layer; and a light-emitting layer, wherein the metal layer and the protection layer are formed to match each other.

14 Claims, 14 Drawing Sheets

(56) References Cited

FOREIGN PATENT DOCUMENTS

JP     2017-182883 A    10/2017
WO    2016/017515 A1   2/2016

* cited by examiner

DISPLAY DEVICE INCLUDING PROTECTION LAYER COVERING METAL LAYER IN TFT LAYER, METHOD FOR PRODUCING DISPLAY DEVICE, AND APPARATUS FOR PRODUCING DISPLAY DEVICE

TECHNICAL FIELD

The present invention relates to a display device including a light-emitting element.

BACKGROUND ART

PTL 1 describes a method for forming, through dry etching, a metal layer such as that for electrodes of a TFT to be connected to organic EL elements.

CITATION LIST

Patent Literature

PTL 1: JP 2009-69251 A (published on Apr. 2, 2009)

SUMMARY

Technical Problem

When a resist is formed in a metal layer and the metal layer is etched, the resist may be etched. For this reason, the resist may be removed from a position at which the resist should remain, which may cause the metal layer may to be formed incorrectly.

In addition, remaining resist, foreign matter, and the like present at the time of etching the metal layer may cause residue of the metal layer to remain without being etched at a position at which the metal layer should be removed based on the original design. To remove such residue, the metal layer is re-etched. The problem of defective formation described above can be significant when re-etching.

Solution to Problem

To solve the problems described above, a display device of the present application is a display device including a TFT layer including a metal layer and a protection layer protecting the metal layer in a layer above the metal layer, and a light-emitting layer, in which the metal layer and the protection layer are formed to match each other.

In addition, in order to solve the problems described above, a manufacturing method for a display device according to the present application is a manufacturing method for a display device including a TFT layer including a metal layer and a protection layer protecting the metal layer in a layer above the metal layer, and a light-emitting layer, the method comprising:

a metal layer formation process of forming the metal layer by using a mask; and a protection layer formation process of forming the protection layer by using a mask having the same pattern as the mask following the metal layer formation process.

Furthermore, in order to solve the problems described above, an apparatus for manufacturing a display device according to the present application is an apparatus for manufacturing a display device including a TFT layer including a metal layer and a protection layer protecting the metal layer in a layer above the metal layer, and a light-emitting layer, the apparatus including a film formation apparatus configured to form the metal layer by using a mask and form the protection layer by using a mask having the same pattern as the mask following the formation of the metal layer.

Advantageous Effects of Invention

According to the configuration described above, it is possible to provide a display device in which formation defects of a metal layer are reduced.

DESCRIPTION OF EMBODIMENTS

First Embodiment

Hereinafter, "same layer" means a layer that is formed using the same material in the same process. In addition, "lower layer" means a layer that is formed in a process prior to that of a comparison layer, and "upper layer" means a layer that is formed in a process after that of a comparison layer. In this specification, a direction from a lower layer to an upper layer of a display device will be described as an upward direction.

Figure 1:
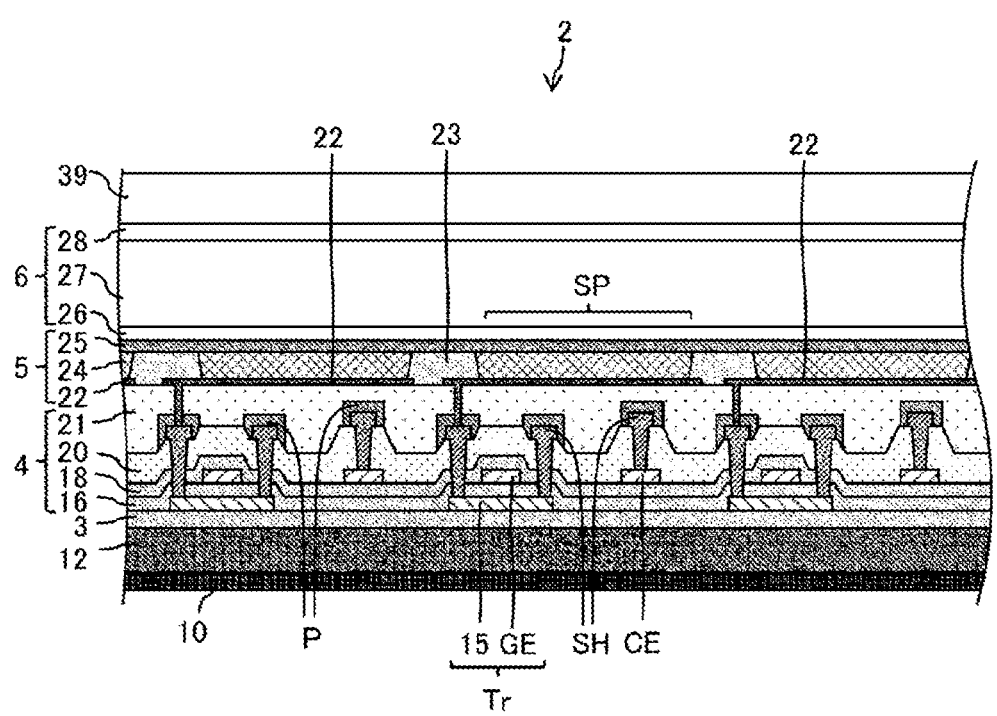
FIG. 1 is a cross-sectional view of a light-emitting region of a display device according to a first embodiment.
Figure 2:
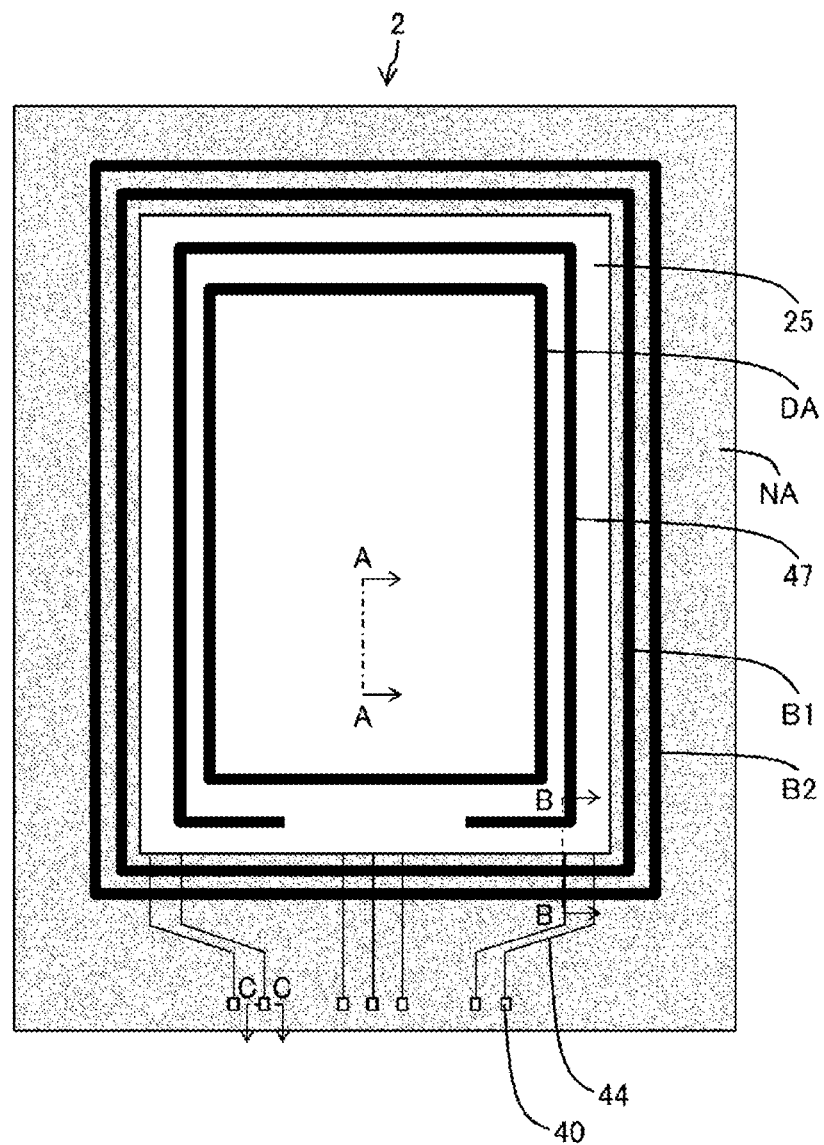
FIG. 2 is a top view of the display device according to the first embodiment.
Figure 3:
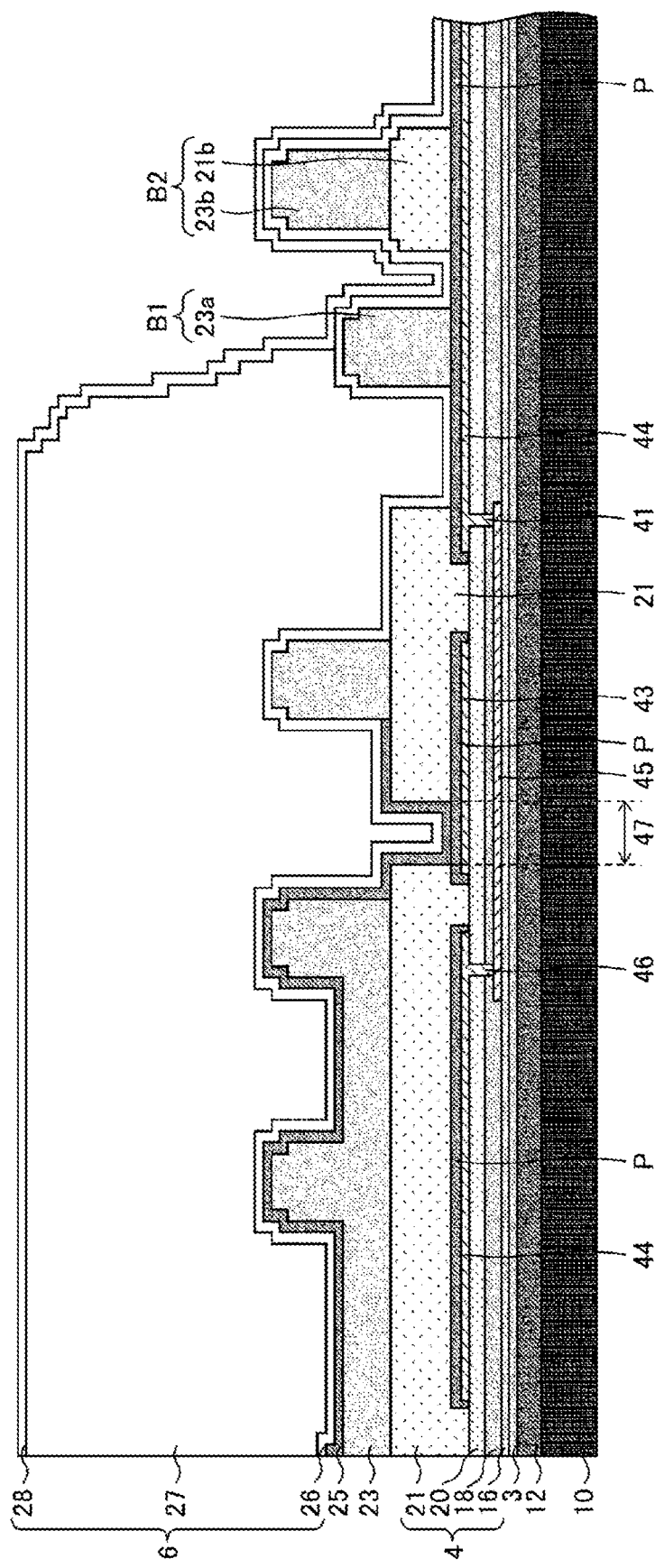
FIG. 3 is a cross-sectional view of the periphery of a first bank and a second bank in a frame region of the display device according to the first embodiment.
Figure 4:
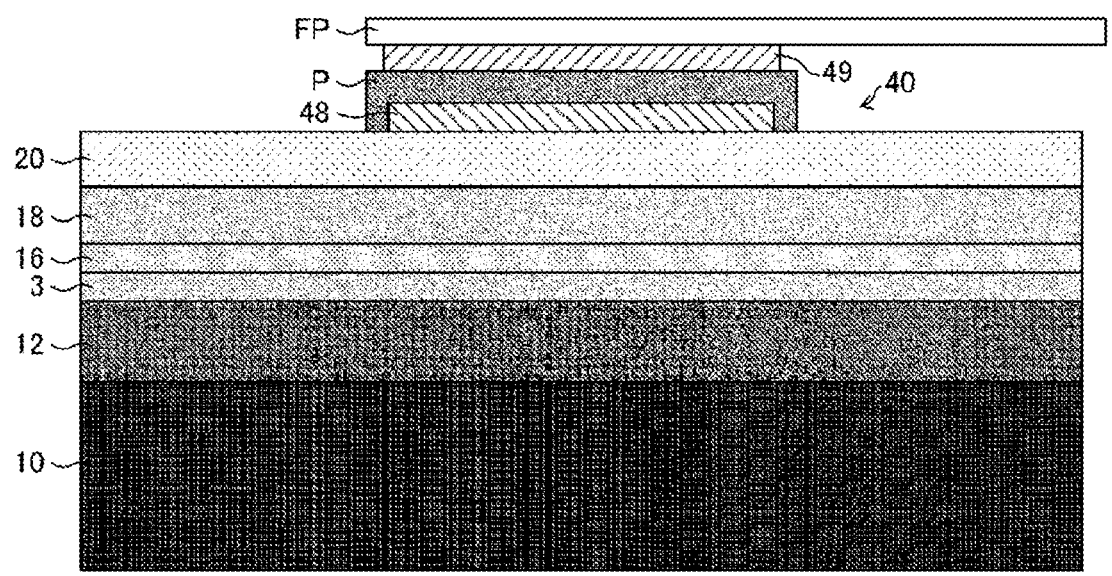
FIG. 4 is a cross-sectional view illustrating the periphery of a terminal portion in the frame region of the display device according to the first embodiment.

FIG. 2 is a top view of a display device 2 according to the present embodiment. FIG. 1 is an arrow cross-sectional view taken along the line A-A in FIG. 2, FIG. 3 is an arrow cross-sectional view taken along the line B-B in FIG. 2, and FIG. 4 is an arrow cross-sectional view taken along the line C-C in FIG. 2.

As illustrated in FIG. 1, the display device 2 according to the present embodiment includes a light-emitting region DA and a frame region NA around the periphery of the light-emitting region DA. The display device 2 according to the present embodiment will be described in detail with reference to FIG. 1.

As illustrated in FIG. 1, the display device 2 according to the present embodiment includes a support substrate 10, a resin layer 12, a barrier layer 3, a TFT layer 4, a light-emitting element layer 5, a sealing layer 6, and an upper face film 39 in order from the bottom layer.

The support substrate 10 may be, for example, a glass substrate. The material of the resin layer 12 may be, for example, polyimide.

The barrier layer 3 is a layer that prevents foreign matter such as water and oxygen from penetrating the TFT layer 4 and the light-emitting element layer 5 when the display device 2 is used. The barrier layer 3 may be configured by a silicon oxide film, a silicon nitride film, or a silicon oxynitride film, or a layered film formed by layering these films formed by using CVD, for example.

The TFT layer 4 includes a semiconductor layer 15, a first inorganic layer 16 (a gate insulating film), a first metal layer GE, a second inorganic layer 20, a second metal layer SH, a protection layer P, and a flattening film 21 (an interlayer insulating film) in order from the bottom layer. The TFT layer 4 also includes a third inorganic layer 18 and a third metal layer CE, which is a layer above the third inorganic layer 18. These layers are layers above the first metal layer GE. A thin layer transistor (TFT) Tr is configured to include the semiconductor layer 15, the first inorganic layer 16, and the first metal layer GE.

The semiconductor layer 15 is composed of, for example, low-temperature polysilicon (LTPS) or an oxide semiconductor. Although the TFT is illustrated in FIG. 2 as having the semiconductor layer 15 as a channel and having a top gate structure, the TFT may have a bottom gate structure (for example, in a case where the channel of the TFT is an oxide semiconductor).

The first metal layer GE, the second metal layer SH, or the third metal layer CE may contain, for example, at least one of aluminum (Al), tungsten (W), molybdenum (Mo), tantalum (Ta), chromium (Cr), titanium (Ti), and copper (Cu). In addition, the first metal layer GE, the second metal layer SH, or the third metal layer CE is composed of a single-layer film or a layered film of the metals described above. Particularly, in the present embodiment, the first metal layer GE contains Mo, and the second metal layer SH contains Al. In addition, the second metal layer SH may be a layered film formed by layering Ti/Al/Ti.

The first inorganic layer 16, the third inorganic layer 18, and the second inorganic layer 20 can be composed of a silicon oxide ($SiO_x$) film or a silicon nitride ($SiN_x$) film or a layered film formed by layering these films formed by using, for example, a CVD method. The flattening film 21 can be composed of a coatable photosensitive organic material such as polyimide or acryl.

In the present embodiment, the protection layer P is formed between the second metal layer SH and the flattening film 21. The protection layer P is formed with the same pattern as the second metal layer SH to match the second metal layer SH. The term "match" used herein means being formed using the same mask pattern and does not mean being provided at a precisely matching position. Particularly, protection layers P are formed at a position overlapping the second metal layer SH and at a position covering at least a side face of the second metal layer SH. The protection layer P has a function of protecting the second metal layer SH and may be an inorganic layer. Particularly, in the present embodiment, the protection layer P is a metal layer and is in contact with the second metal layer SH.

The light-emitting element layer 5 (for example, an organic light-emitting diode layer) includes a pixel electrode 22 (a first electrode, for example, an anode), a cover film 23 covering the edge of the pixel electrode 22, a light-emitting layer 24, and an upper electrode (a second electrode, for example, a cathode) 25 in order from the bottom layer. In the light-emitting element layer 5, a light-emitting element (for example, an organic light-emitting diode (OLED)) that includes the island-shaped pixel electrode 22, the island-shaped light-emitting layer 24, and the upper electrode 25, and a subpixel circuit that drives these components are disposed for each of a plurality of subpixels SP.

The cover film 23 is an organic insulating film and is formed by, for example, applying a photosensitive organic material such as a polyimide or an acryl and then patterning the photosensitive organic material using a photolithographic method. The cover film 23 includes an opening for each of the plurality of subpixels SR.

The light-emitting layer 24 is formed by, for example, layering a hole transport layer, a light-emitting layer, and an electron transport layer in order from the bottom layer. The light-emitting layer is formed into an island shape for each subpixel SP by using a vapor deposition method or an inkjet method. The hole transport layer and the electron transport layer may be formed into an island shape for each subpixel SP or may be formed into a solid shape as a common layer for the plurality of subpixels SP.

The pixel electrode 22 is formed into an island shape for each of the plurality of subpixels SP and is configured by, for example, layering indium tin oxide (ITO) and an alloy containing Ag, and has light reflectivity. In the present embodiment, the pixel electrodes 22 are electrically connected to the protection layers P, and thus, in each subpixel, the source electrode of the TFT layer 4 and the pixel electrodes 22 are electrically conductive through the protection layers P.

The upper electrode 25 is formed into a solid shape as a common layer for the plurality of subpixels SP and can be composed of a light-transmitting conductive material such as indium tin oxide (ITO) or indium zinc oxide (IZO).

In a case where the light-emitting element layer 5 is an OLED layer, holes and electrons are recombined inside the light-emitting layer 24 due to a drive current between the pixel electrode 22 and the upper electrode 25, and excitons generated in accordance therewith fall to a ground state, whereby light is emitted. The upper electrode 25 is transparent and the pixel electrode 22 reflects light, and thus light emitted from the light-emitting layer 24 is directed upward to configure a top emission structure.

The sealing layer 6 includes an inorganic sealing film 26 in an upper layer overlying the upper electrode 25, an organic sealing film 27 in an upper layer overlying the inorganic sealing film 26, and an inorganic sealing film 28 in an upper layer overlying the organic sealing film 27, and prevents foreign matter such as water and oxygen from penetrating the light-emitting element layer 5. The inorganic sealing films 26 and 28 can be configured as silicon oxide films, silicon nitride films, silicon oxynitride films, or layered films formed by layering these films that are formed by, for example, using CVD. The organic sealing film 27 can be composed of a coatable photosensitive organic material such as a polyimide or an acryl.

The upper face film 39 may be, for example, a function film having an optical compensation function, a touch sensor function, a protection function, and the like.

As illustrated in FIG. 2, the display device 2 includes a first bank B1, a second bank B2, and terminal portions 40 in the frame region NA. The first bank B1 is formed into a frame shape at a position surrounding the periphery of the upper electrode 25. The second bank B2 is formed into a frame shape around the periphery of the first bank B1. The terminal portions 40 are formed around the periphery of the second bank B2.

FIG. 3 is an arrow cross-sectional view taken along the line B-B in FIG. 2 and illustrates the periphery of banks in the frame region NA around the periphery of the light-emitting region DA of the display device 2 according to the present embodiment. As illustrated in FIG. 3, the first bank B1 includes a first bank cover film 23a in the same layer as the cover film 23. The second bank B2 includes a second bank flattening film 21b in the same layer as the flattening film 21 and a second bank cover film 23b in the same layer as the cover film 23. The first bank B1 and the second bank B2 regulate wet-spreading of the organic sealing film 27 due to coating the organic sealing film 27 with the sealing layer 6, which is a higher layer than the organic sealing film 27.

The terminal portion 40 connects the second metal layer SH formed to extend to the frame region NA and a lead wiring line 44 in the same layer as the second metal layer SH, and inputs a signal from outside the terminal portion to the display region DA. As illustrated in FIG. 4, the terminal portion 40 includes a terminal metal layer 48 that is in the same layer as the second metal layer SH and is formed using the same material as the second metal layer SH. The terminal metal layer 48 is electrically connected to the lead wiring line 44.

A plurality of lead wiring lines 44 are formed in slits formed surrounding the display region DA in the flattening film 21 between the first bank B1 and the display region DA. The lead wiring lines 44 cross the above-described slits on the second inorganic layer 20 in the direction of the light-emitting region DA and extend to positions in front of the flattening film 21. Here, peripheral end edges of the organic sealing film 27 overlap the slits.

In addition, in the frame region NA, a lead wiring line 45 is formed in the same layer as a gate electrode DE and is connected to the lead wiring line 44 at a first wiring line contact portion 41. The first wiring line contact portion 41 is formed further on a peripheral side than the flattening film 21 and further on an inner side than the first bank B1. A lead wiring line connected to the terminal portion 40 is drawn around from the lead wiring line 44 and bypasses the lead wiring line 45 at the first wiring line contact portion 41. For this reason, the lead wiring lines 44 and 45 are separated from and not in contact with the flattening film 21.

Here, in the present embodiment, as illustrated in FIG. 3, the protection layer P formed from an inorganic insulating material to be described later is formed at a position covering the upper face and the side face of the lead wiring line 44. In addition, as illustrated in FIG. 4, the protection layer P formed of a metal material or a metal oxide of a conductor to be described later is also formed at positions covering the upper face and the side face of the terminal metal layer 48 in the terminal portion 40. For this reason, in the terminal portion 40, a signal from outside the terminal portion is input to the terminal metal layer 48 and further to the lead wiring line 44 through the protection layer P. In addition, as illustrated in FIG. 4, the connection between an externally-mounted device and the display device 2 may be achieved through the protection layer P in the terminal portion 40 being electrically connected to a flexible printed circuit board FP of the externally-mounted device through an ACF 49.

As illustrated in FIG. 3, a conductive layer 43, which is electrically connected to the upper electrode 25, is formed on an outer edge of the display region DA. The conductive layer 43 is in the same layer as the second metal layer SH. In the present embodiment, as illustrated in FIG. 3, the protection layer P formed of a metal material or a metal oxide of a conductor to described later is also formed at positions covering the top face and the side face of the conductive layer 43. For this reason, the upper electrode 25 and the conductive layer 43 are electrically connected via the protection layer P in trenches 47 formed in the flattening film 21 and the cover film 23.

In addition, the lead wiring line 45 extends from the first wiring line contact portion 41 to the display region while intersecting an end portion of the flattening film 21 and the conductive layer 43. The lead wiring line 45 is connected to the lead wiring line 44 through a second wiring line contact portion 46. The second wiring line contact portion 46 is formed between the display region DA and the conductive layer 43. The lead wiring line 44 in the display region DA is connected to each TFT.

Figure 5:
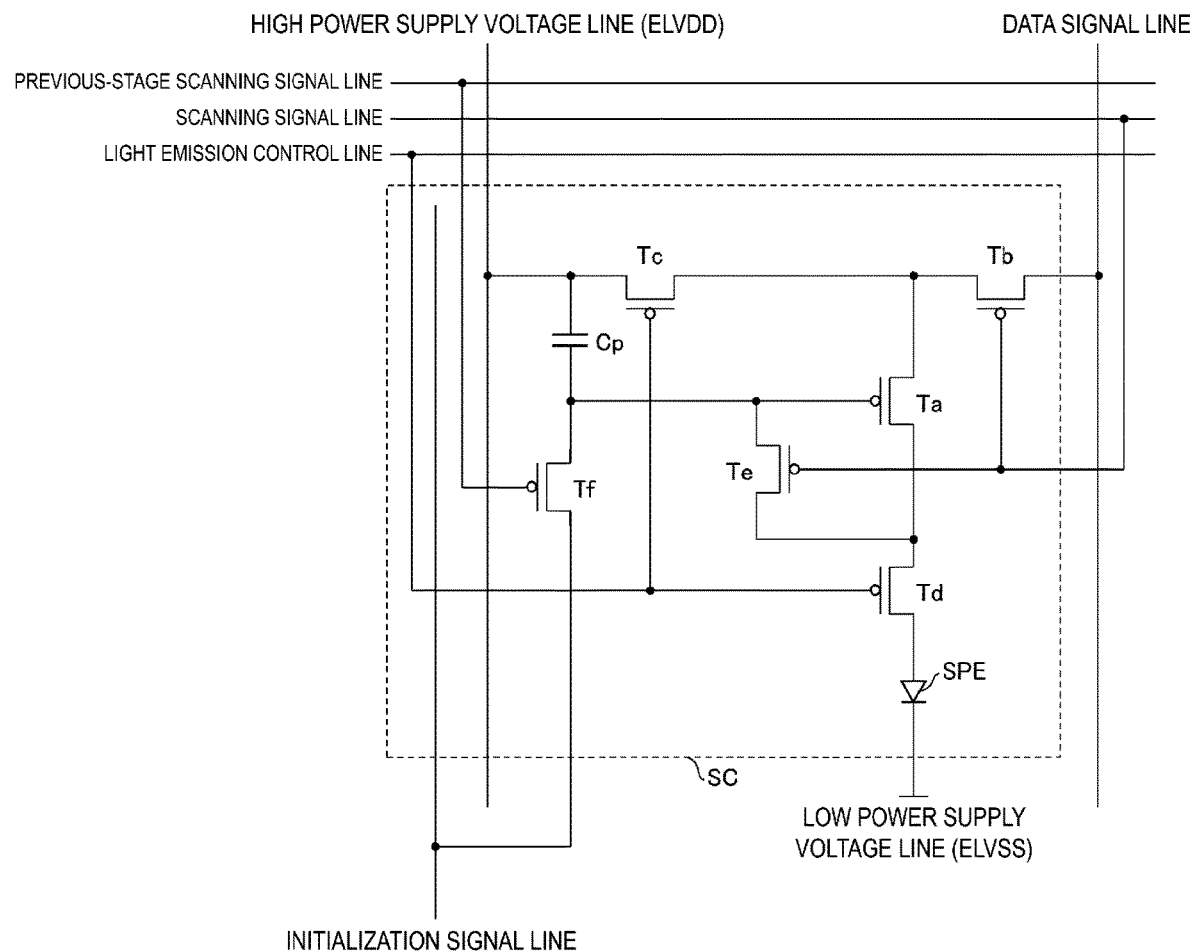
FIG. 5 is an equivalent circuit diagram illustrating an example of a subpixel circuit of the display device according to the first embodiment.

FIG. 5 is an equivalent circuit diagram illustrating an example of a subpixel circuit SC used for driving a light-emitting element SPE of each subpixel SP and signal lines connected to each subpixel circuit SC. In the present embodiment, one subpixel circuit SC is formed for each subpixel SP in the display device 2. Each subpixel circuit SC includes transistors Ta to Tf, a capacitor Cp, and a light-emitting element SPE.

As illustrated in FIG. 5, the transistors Ta to Tf and the capacitor Cp are each connected to a high power supply voltage line (ELVDD), a previous-stage scanning signal line, a scanning signal line, a light emission control line, a data signal line, and an initialization signal line. The light-emitting element SPE includes the island-shaped pixel electrode 22 that is connected to the transistor Td, the solid-like upper electrode 25 that is connected to a low power supply voltage line (ELVSS), and the island-shaped light-emitting layer 24 between the pixel electrode 22 and the upper electrode 25.

One electrode of the capacitor Cp is connected to the high power supply voltage line, and the other electrode is connected to the initialization signal line through the transistor Tf. In an on period of the previous-stage scanning signal line, the electric capacitance of the capacitor Cp is initialized through the transistor Tf and the initialization signal line.

In an on period of the scanning signal line, an analog signal corresponding to a gray scale value of the light-emitting element SPE is input from a data signal line. The voltage of this analog signal may be 3 to 6 V. In the on period of the light emission signal line, the light-emitting element SPE emits light in response to the analog signal input from the data signal line.

Here, in the present embodiment, the high power supply voltage line and the data signal line are formed in the second metal layer SH and are formed using the same material as the second metal layer SH. The previous-stage scanning signal line, the scanning signal line, and the light emission control line may be formed in the first metal layer GE, and the initialization signal line may be formed in the second metal layer SH or the third metal layer CE. Furthermore, an electrode of the capacitor Cp that is connected to the high power supply voltage line may be formed in the third metal layer CE, and an electrode of the capacitor CP that is connected to the initialization signal line may be formed in the first metal layer GE. A driver of the scanning signal line and a driver of the light emission control line may be formed inside a panel of the display device 2. Furthermore, in the present embodiment, the lead wiring line 44 may be electrically connected to the data signal line disposed in the display region DA.

Figure 6:
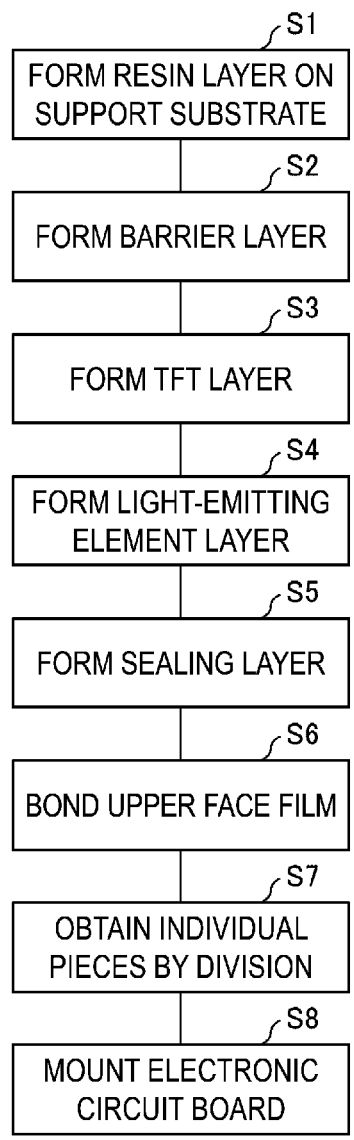
FIG. 6 is a flowchart illustrating a manufacturing method for the display device according to the first embodiment.
Figure 7:
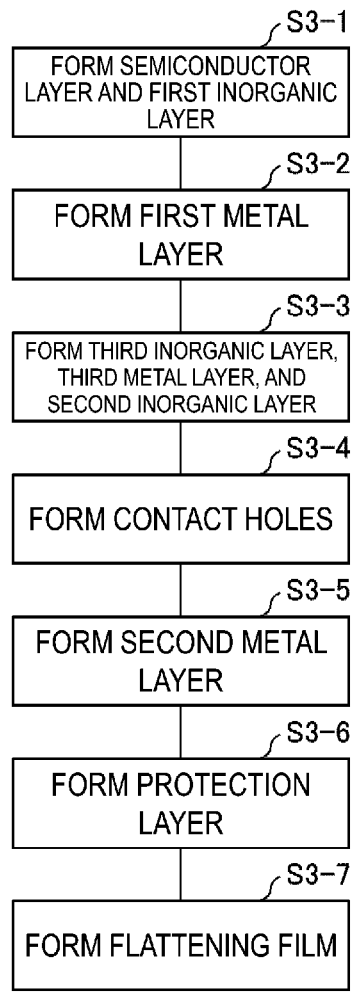
FIG. 7 is a flowchart illustrating in more detail a method for forming a TFT layer in the manufacturing method for the display device according to the first embodiment.
Figure 8:
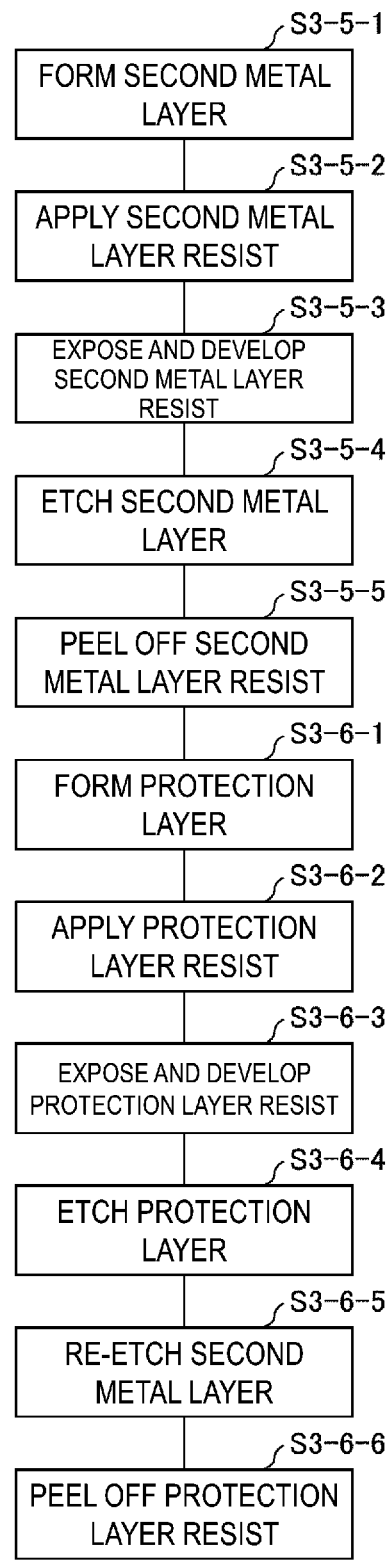
FIG. 8 is a flowchart illustrating in more detail a method for forming a second metal layer and a protection layer in the manufacturing method for the display device according to the first embodiment.
Figure 9:
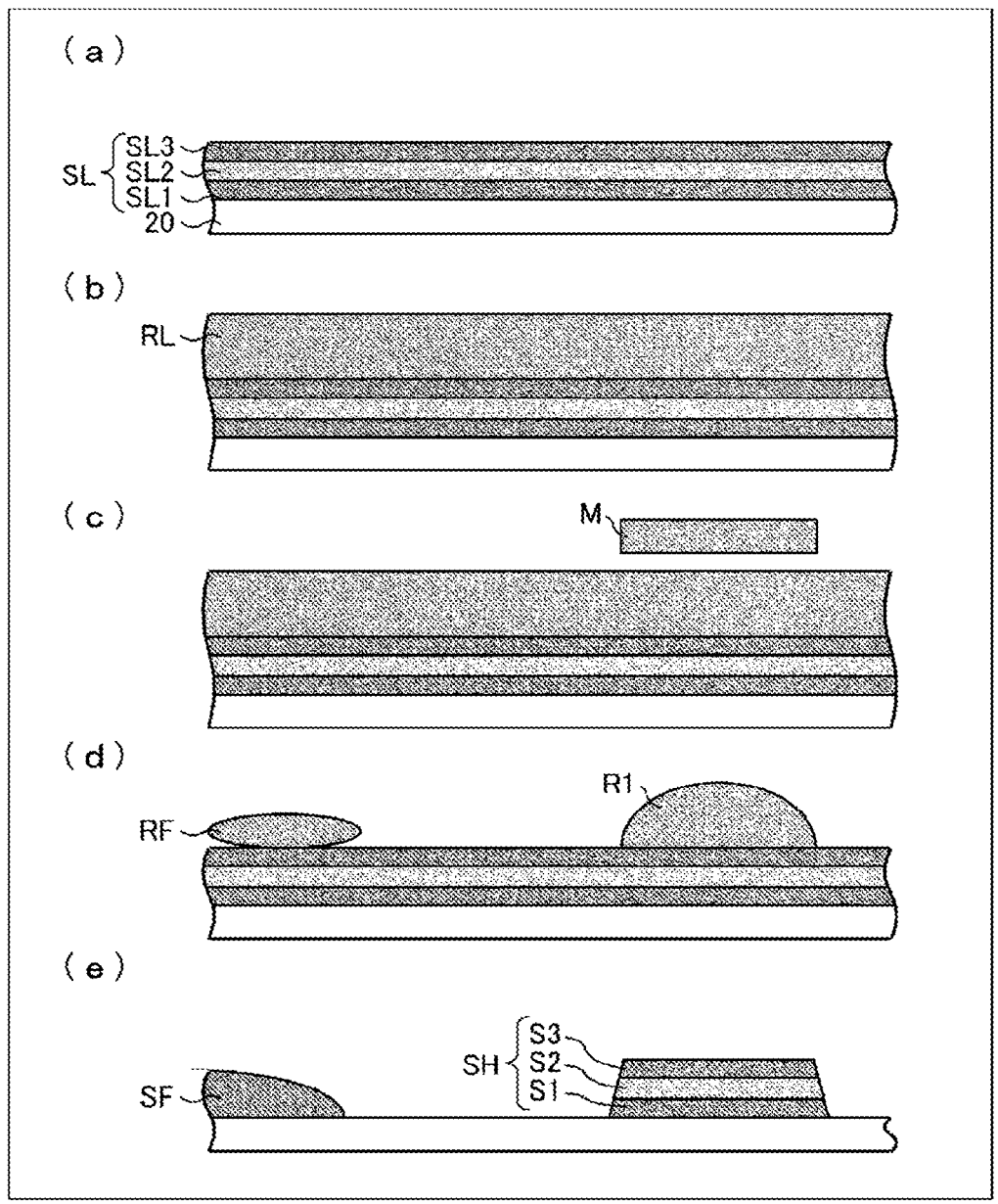
FIG. 9 is a process cross-sectional view illustrating a method for forming the second metal layer of the display device according to the first embodiment.
Figure 10:
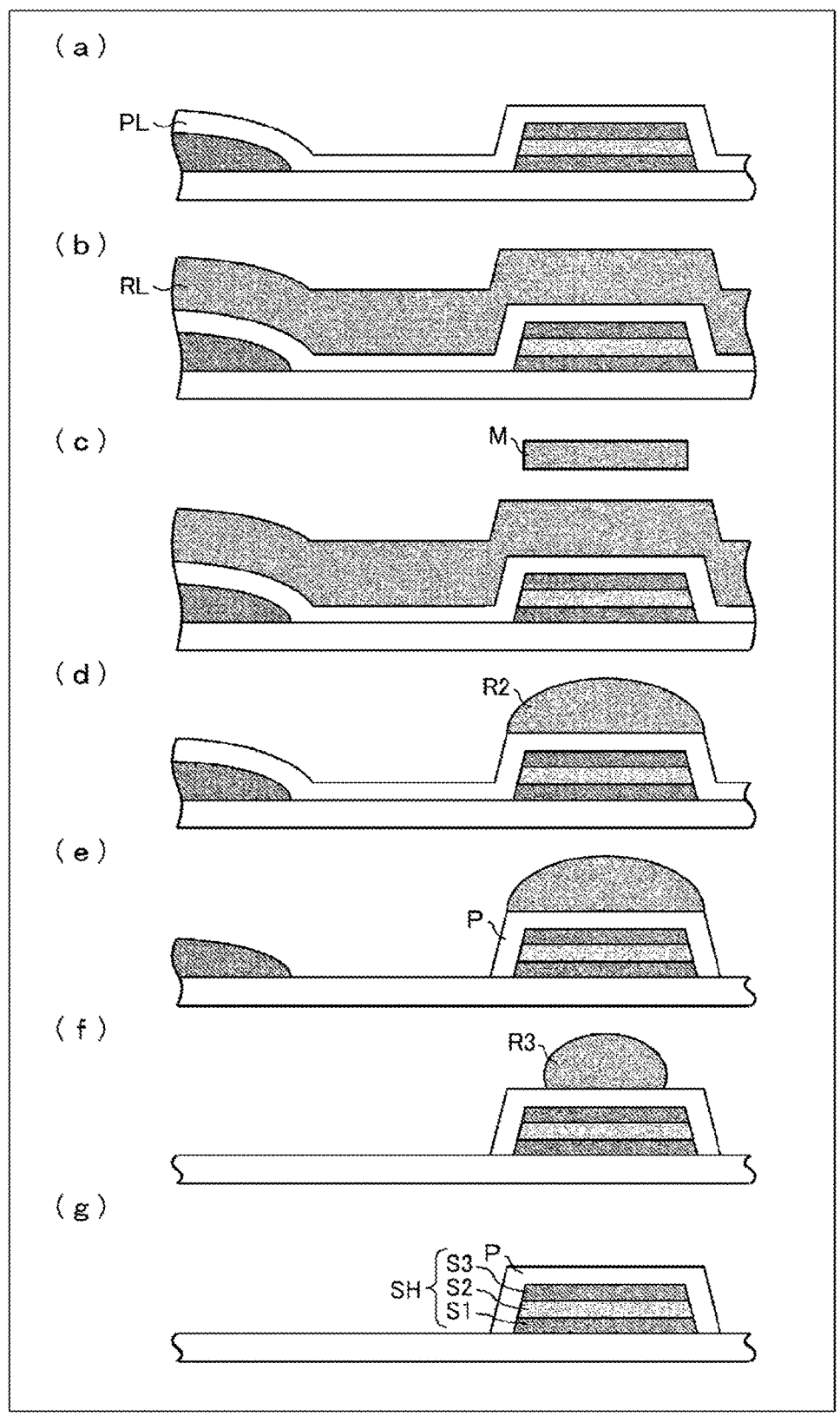
FIG. 10 is a process cross-sectional view illustrating a method for forming the protection layer of the display device according to the first embodiment.

A manufacturing method for the display device 2 according to the present embodiment will be described in detail with reference to the flowcharts of FIGS. 6 to 8 and the process cross-sectional views of FIGS. 9 and 10. FIGS. 9 and 10 are enlarged cross-sectional views of the periphery of the second metal layer SH in Step S3.

First, the resin layer 12 is formed on a transparent support substrate (for example, a mother glass substrate) (Step S1). Next, the barrier layer 3 is formed in a layer above the resin layer 12 (Step S2).

Next, the TFT layer 4 is formed in a layer above the barrier layer 3 (Step S3). Next, a top-emitting type light-emitting element layer (for example, an OLED element layer) 5 is formed (Step S4).

Step S3 will be described in more detail with reference to the flowchart of FIG. 7. In Step S3, first, the semiconductor layer 15 and the first inorganic layer 16 are formed in layers above the barrier layer 3 in order from the bottom layer (Step S3-1). Next, the first metal layer GE is formed (Step S3-2). At this time, the lead wiring line 45 connected to the terminal portion 40 is formed in the same layer as the first metal layer GE.

Next, the third inorganic layer 18, the third metal layer CE, and the second inorganic layer 20 are sequentially formed in order from the bottom layer (Step S3-3). For this reason, in the frame region NA, the third inorganic layer 18 and the second inorganic layer 20 are formed above the first metal layer GE.

Next, in the layers above the first metal layer GE in the frame region NA, openings are formed in the third inorganic layer 18 and the second inorganic layer 20 to thereby form contact holes. These contact holes may be formed together with contact holes used for forming a contact between the semiconductor layer 15 and the second metal layer SH and a contact between the third metal layer CE and the second metal layer SH.

Next, the second metal layer SH is formed (Step S3-5). At this time, the lead wiring line 44 is formed in the same layer as the second metal layer SH. The lead wiring line 44 is also formed in the contact holes described above. In this way, in the frame region NA, the lead wiring line 44 and the lead wiring line 45 are connected at the first wiring line contact portion 41 and the second wiring line contact portion 46. In addition, in Step S3-5, the conductive layer 43 is formed in the same layer as the second metal layer SH.

Step S3-5 will be described in more detail with reference to the flowchart illustrated in FIG. 8 and the process cross-sectional view illustrated in FIG. 9.

First, as illustrated in (a) of FIG. 9, a second metal layer SL is formed on an upper face of the second inorganic layer 20 (Step S3-5-1). The second metal layer SL may be formed on the entire upper face of the second inorganic layer 20. A lower Ti layer SL1, an Al layer SL2, and an upper Ti layer SL3 are formed in order from the bottom layer. The lower Ti layer SL1 and the upper Ti layer SL3 contain Ti, and the Al layer SL2 contains Al.

Next, as illustrated in (b) of FIG. 9, the upper face of the second metal layer SL is coated with a second metal layer resist (Step S3-5-2). In the present embodiment, the second metal layer resist is a photoresist RL containing a positive photosensitive material. Next, as illustrated in (c) of FIG. 9 a photomask M is disposed, and the photoresist RL is exposed and developed (Step S3-5-3). In this way, a photoresist R1 illustrated in (d) of FIG. 9 can be acquired.

In the state illustrated in (d) of FIG. 9, by etching the second metal layer SL (Step S3-5-4), the second metal layer SH including a lower Ti layer S1, an Al layer S2, and an upper Ti layer S3 illustrated in (e) of FIG. 9 can be acquired. The etching of the second metal layer SL may be dry etching. Finally, by peeling off the photoresist R1 (Step S3-5-5), Step S3-5 is completed.

In Step S3-5-3, as illustrated in (d) of FIG. 9, a resist defect RF may remain on the second metal layer SL. An example of the resist defect RF is residue of the photoresist RL due to defects in development of the photoresist RL, foreign matter adhering to the second metal layer SL at the time of development, and a product generated from the inside of an etching chamber during etching. When the process of Step S3-5-4 is performed in a state in which the resist defect RF remains on the second metal layer SL, as illustrated in (e) of FIG. 9, an etching defect SF of the second metal layer SL may be formed on the upper face of the second inorganic layer 20.

When the subsequent film deposition process is performed in a state in which the etching defect SF remains, a problem such as short-circuiting between the etching defect SF and an electrode in a higher layer, or penetration of moisture from the periphery of the etching defect SF may occur, and thus the etching defect SF is removed. In the present embodiment, the etching defect SF is removed by re-etching of the second metal layer SH that is performed in Step S3-6.

Step S3-6 will be described in more detail with reference to the flowchart illustrated in FIG. 8 and the process cross-sectional view illustrated in FIG. 10.

First, as illustrated in (a) of FIG. 10, a protection layer PL is formed on the upper faces of the second inorganic layer 20, the second metal layer SH, and the etching defect SF (Step S3-6-1). The protection layer PL may be formed on the entire upper faces of the second inorganic layer 20, the second metal layer SH, and the etching defect SF.

Next, as illustrated in (b) of FIG. 10, an upper face of the protection layer PL is coated with a protection layer resist (Step S3-6-2). In the present embodiment, the protection layer resist is the same as the photoresist RL. Next, as illustrated in (c) of FIG. 10, the photomask M described above or a mask having the same opening pattern as the photomask M is disposed, and the photoresist RL is exposed and developed (Step S3-6-3). In this way, a photoresist R2 illustrated in (d) of FIG. 10 can be acquired.

In the state illustrated in (d) of FIG. 10, by etching the protection layer PL (Step S3-6-4), the protection layer P illustrated in (e) of FIG. 10 can be acquired. The protection layer PL is etched such that the remaining protection layer P covers the upper face and the end face of the second metal layer SH.

In the state illustrated in (e) of FIG. 10, the second metal layer SH is re-etched (Step S3-6-5). In the present embodiment, an etching method in which the second metal layer SH is etched and the protection layer P is not etched is employed for the re-etching. The re-etching can be realized by appropriately selecting a material that is not etched when etching the second metal layer SH as the material of the protection layer P. Examples of the material that is not etched when etching the second metal layer SH, that is, the material of the protection layer P, include an inorganic insulating material such as silicon nitride or silicon oxide, or a conductive material such as ITO.

In Step S3-6-5, as illustrated in (f) of FIG. 10, etching defects SF are removed. As described above, the occurrence of etching defects SF can be prevented more reliably by performing a plurality of processes of development and exposure of the photoresist.

At this time, the photoresist R2 may be partly etched by the re-etching and reduced to a photoresist R3. However, the second metal layer SH is protected from etching by the protection layer P, and thus the second metal layer SH is not etched. Finally, Step S3-6 is completed by peeling off the photoresist R3 (Step S3-6-6). Next, the flattening film 21 is formed (Step S3-7), and formation of the TFT layer 4 is completed. Here, the second bank flattening film 21b is formed at the position at which the second bank B2 is formed.

Next, the pixel electrode 22, the cover film 23, the light-emitting layer 24, and the upper electrode 25 are formed in order from the bottom layer to form the light-emitting element layer 5 (Step S4). At the time of forming the pixel electrode 22, although a pixel electrode 22 is also formed on the lead wiring line 44 in the frame region NA, the pixel electrode 22 on the lead wiring line 44 is removed through patterning using sputtering. In addition, the first bank cover film 23a and the second bank cover film 23b are formed together with formation of the cover film 23, to thereby form the first bank B1 and the second bank B2. Furthermore, at the time of forming the upper electrode 25, at an end portion of the flattening film 21, the upper electrode 25 and the conductive layer 43 may be connected by forming the trenches 47 in the flattening film 21 and the cover film 23.

Next, the sealing layer 6 is formed (Step S5). At this time, when forming the organic sealing film 27 of the sealing layer 6, wet-spreading of the organic sealing film 27 is regulated by the first bank B1 and the second bank B2. In Step S5, the second metal layer SH exposed in the frame region NA forms the terminal portion 40, and the terminal portion formation process is completed.

Next, an upper face film is bonded to the sealing layer 6 (Step S6). Next, a layered body including the support substrate 10, the resin layer 12, the barrier layer 3, the TFT layer 4, the light-emitting element layer 5, the sealing layer 6, and the upper face film 39 is divided to obtain a plurality of individual pieces (Step S7). Next, the flexible board FP is mounted to the terminal portion 40 through the ACF 49, and an electronic circuit board (for example, an IC chip) is mounted to obtain the display device 2 (Step S8).

In the present embodiment, a manufacturing method for the display device 2 including the rigid support substrate 10 has been described. However, by adding some processes, a flexible display device 2 can be produced. For example, after Step S6, bonding force between the support substrate 10 and the resin layer 12 is reduced by irradiating the lower face of the resin layer 12 with laser light over the support substrate 10, and the support substrate 10 is peeled off from the resin layer 12. Next, a lower face film is bonded to the lower face of the resin layer 12. Thereafter, the process proceeds to Step S7, and thus the flexible display device 2 can be obtained.

In the display device 2 according to the present embodiment, the protection layer P is formed at a position covering the upper face and the end face of the second metal layer SH. For this reason, formation defects of the second metal layer SH can be reduced, and yield can be improved. Particularly, in the present embodiment, the second metal layer SH is used for the high power supply voltage line and the data signal line, in which short-circuiting due to defects in etching can easily affect the display of the display device 2.

In the present embodiment, as illustrated in FIG. 3, the upper face and the side face of the lead wiring line 44 are covered by the protection layer P that is formed of the inorganic insulating material described above. In this way, at the time of patterning the pixel electrode 22 after forming the flattening film 21, for example, even when the remaining patterning of the pixel electrode 22 is formed on the edge of the slit described above, inter-wiring leakage can be prevented.

In the present embodiment, the protection layer P and the second metal layer SH are in contact with each other. For this reason, in a case where the protection layer P is formed using a conductive metal material or metal oxide as described above, electrical conduction between the second metal layer SH and other members can be achieved by electrical conduction between the other members and the protection layer P. Thus, there is no need to perform a process of removing the protection layer P at a position at which electrical conduction between the second metal layer SH and other members is required.

In the present embodiment, the protection layer P is not limited thereto, and may be a non-conductor, or not be electrically connected to the second metal layer SH. In this case, at a position at which electrical conduction between the second metal layer SH and other members is required, the display device 2 may be manufactured by adding a process of partly removing the protection layer P. For example, after forming the flattening film 21, contact between the second metal layer SH and other members may be achieved by etching the protection layer P exposed in the contact hole formed in the flattening film 21 and exposing the second metal layer SH.

In the present embodiment, a terminal metal layer 48 of the terminal portion 40 is the same layer as the second metal layer SH, and the protection layer P is formed at a position covering the upper face and the end face. For this reason, in a case where the protection layer P and the terminal metal layer 48 are in contact with each other, for example, an externally-mounted device and the terminal portion 40 can be mounted by electrically connecting the externally-mounted device and the protection layer P formed on the terminal metal layer 48. In a case where the protection layer P is electrically insulated from the terminal metal layer 48, an externally-mounted device and the terminal portion 40 may be mounted by partly removing the protection layer P overlapping the upper face of the terminal metal layer 48 and directly connecting the terminal metal layer 48 and the ACF 49.

Here, when layers above the terminal metal layer 48 are formed, in order to prevent damage caused by an end face of the terminal metal layer 48, the end face of the terminal metal layer 48 needs to be covered. In the present embodiment, the end face of the terminal metal layer 48 is covered with the protection layer P, and thus, compared to a case where the terminal metal layer 48 is covered with the flattening film 21 or the like, unevenness of the upper face of the terminal metal layer 48 can be reduced, mounting defects can be decreased, and the terminal metal layer 48 can be easily protected.

In the present embodiment, after forming the flattening film 21 and the second bank flattening film 21b that overlap the lead wiring line 44, the pixel electrode 22 is formed on the lead wiring line 44, the flattening film 21, and the second bank flattening film 21b. For this reason, residue such as remaining patterning of the pixel electrode 22 and the like may easily occur below the end faces of the flattening film 21 and the second bank flattening film 21b that are largely uneven. Particularly, in a case where the protection layer P is not formed, positions at which residue of the pixel electrode 22 can easily occur become contact positions of the flattening film 21 and the second bank flattening film 21b with the lead wiring line 44.

However, in the present embodiment, the protection layer P is formed at positions covering the upper face and the end face of the lead wiring line 44, and thus the flattening film 21 and the second bank flattening film 21b are not in direct contact with the lead wiring line 44. For this reason, in a case where the protection layer P and the lead wiring line 44 are electrically insulated from each other, for example, short-circuiting between the lead wiring line 44 and residue of the pixel electrode 22 that occurs below the end faces of the flattening film 21 and the second bank flattening film 21b can be reduced.

Figure 11:
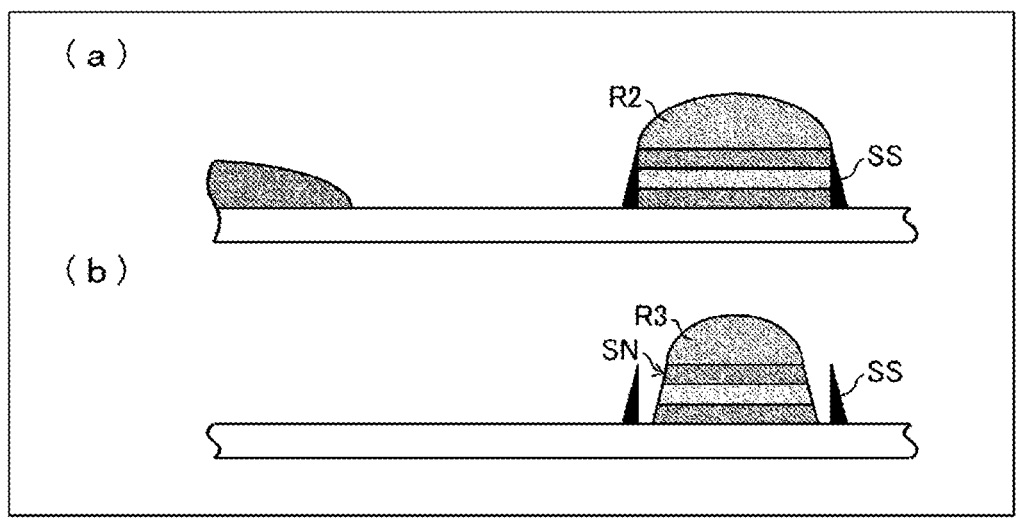
FIG. 11 is a process cross-sectional view illustrating a method for forming a second metal layer of a display device according to a comparative embodiment.

FIG. 11 is a cross-sectional view illustrating a method for forming a second metal layer SH according to a comparative embodiment. In the comparative embodiment, compared to the present embodiment, it is assumed that up to Step S3-5 has been completed using the same processes. Here, in the comparative embodiment, starting in the state illustrated in (e) of FIG. 9, the protection layer P is not formed, and the second metal layer SH is re-etched. For this reason, as illustrated in (a) of FIG. 11, the photoresist R2 is directly formed on the upper face of the second metal layer SH.

For this reason, in a case where the photoresist R2 is reduced to the photoresist R3 through the re-etching described above, a portion of the second metal layer SH that is not to be originally etched may be etched. In a case where the re-etching is continued in such a state, the thinned second metal layer SN illustrated in (b) of FIG. 11 is formed. Therefore, a defect in which the second metal layer SH is formed to be smaller than designed occurs.

Here, on an end face of the second metal layer SH, an end face product SS illustrated in (a) of FIG. 11 is generated. The side face product SS is, for example, an alternation of an Al layer S2 exposed from two Ti layers when the second metal layer SH is etched for the first time or when the second metal layer SH is exposed to air after etching.

The side face product SS may be a material that is not etched through re-etching. For this reason, as illustrated in (b) of FIG. 11, there is a risk that the side face product SS may remain on the second inorganic layer 20 even after re-etching. For this reason, problems such as short-circuiting with a member of a higher layer, or infiltration of moisture from the periphery of the side face product SS due to the remaining side face product SS may occur.

In the present embodiment, in the stage illustrated in (e) of FIG. 9, it is assumed that the side face product SS is generated on the end face of the second metal layer SH. However, in the present embodiment, second etching is performed while the second metal layer SH is covered with the protection layer P. Therefore, defects in etching of the second metal layer SH are reduced, and thus only the side face product SS of the second metal layer SH is less likely to remain.

Second Embodiment

Figure 12:
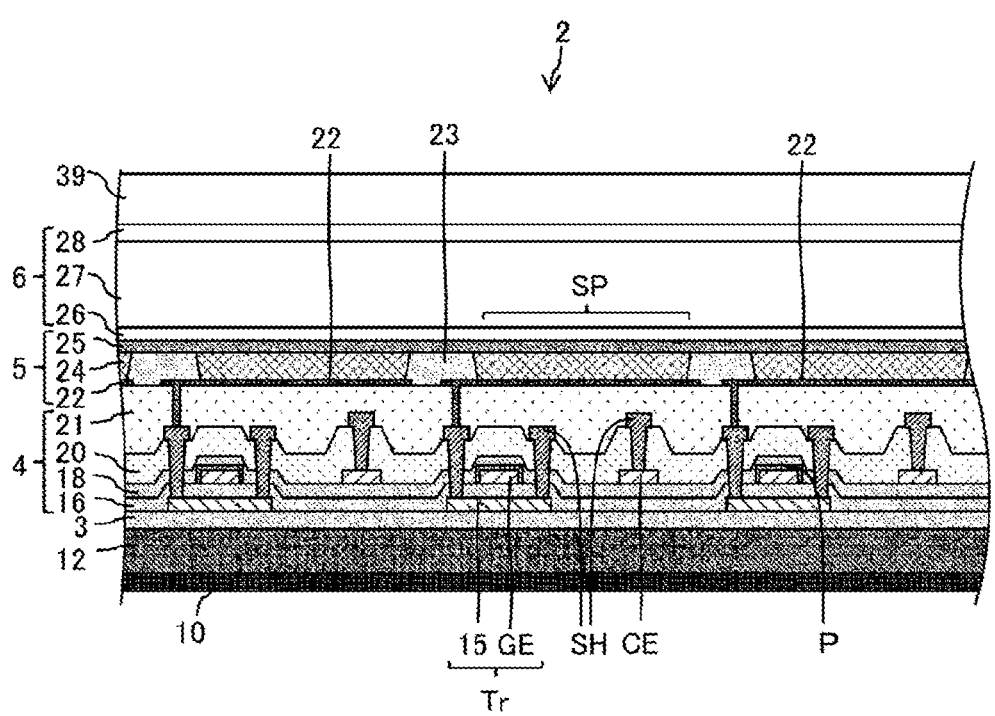
FIG. 12 is a cross-sectional view of a light-emitting region of the display device according to the first embodiment.

FIG. 12 is a cross-sectional view illustrating the display device 2 according to the present embodiment. The configuration of the display device 2 according to the present embodiment is different from that of the display device 2 according to the previous embodiment only in that the protection layer P is formed to match the first metal layer GE. FIG. 12 is a diagram illustrating a configuration of positions, which correspond to those of FIG. 1, in the display device 2 according to the present embodiment. The display device 2 according to the present embodiment may be obtained by performing Step S3-6 following Step S3-2 in the manufacturing method for the display device 2 according to the previous embodiment.

In the display device 2 according to the present embodiment, the protection layer P is formed at a position covering an upper face and an end face of the first metal layer GE. For this reason, formation defects of the first metal layer GE are reduced, and yield can be improved. In addition, in the present embodiment, the protection layer P and the second metal layer SH may be formed to match each other.

In the present embodiment, a configuration in which the display device 2 includes a TFT having a top gate structure and the protection layer P is formed at positions covering the upper face and the end face of the gate electrode of the TFT has been described, but the configuration is not limited thereto. A modification example of the present embodiment may be a configuration in which the display device 2 includes a TFT having a bottom gate structure and the protection layer P is formed at positions covering the upper face and the end face of the gate electrode of the TFT. Also according to the display device 2 of the modification example described above, effects similar to those of the present embodiment can be acquired.

Third Embodiment

Figure 13:
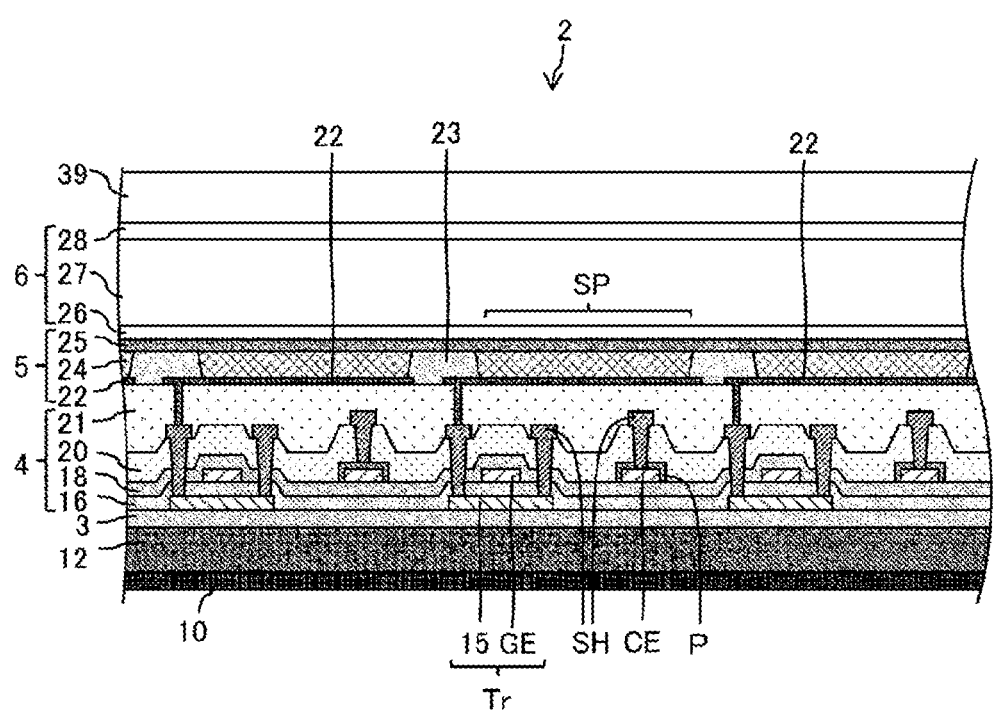
FIG. 13 is a cross-sectional view of a light-emitting region of the display device according to the first embodiment.

FIG. 13 is a cross-sectional view illustrating a display device 2 according to the present embodiment. The configuration of the display device 2 according to the present embodiment differs from that of the display device 2 according to the previous embodiment only in that the protection layer P is formed to match a third metal layer CE. FIG. 13 is a diagram illustrating a configuration of positions, which correspond to those of FIG. 1, in the display device 2 according to the present embodiment. The display device 2 according to the present embodiment may be obtained by performing Step S3-6 following the process of forming the third metal layer CE of Step S3-3 in the manufacturing method for the display device 2 according to the previous embodiment.

In the display device 2 according to the present embodiment, the protection layer P is formed at positions covering the upper face and the end face of the third metal layer CE. For this reason, formation defects of the third metal layer CE are reduced, and yield can be improved. In addition, in the present embodiment, the protection layer P and the second metal layer SH may be formed to match each other, or the protection layer P and the first metal layer GE may be formed to match other.

Figure 14:
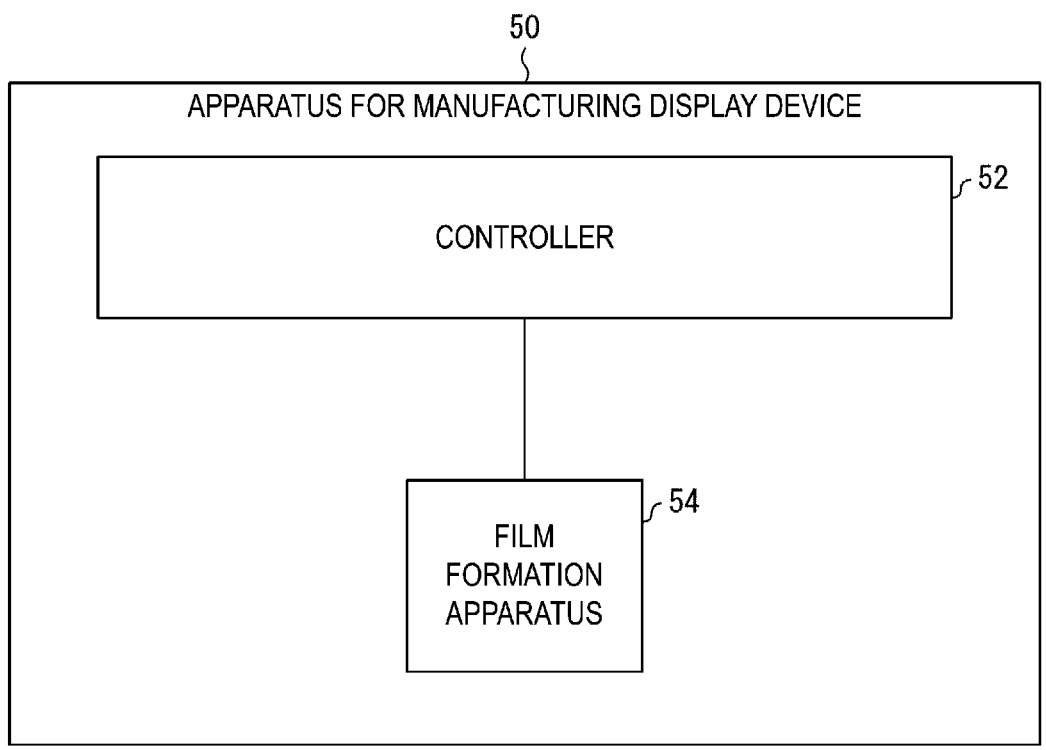
FIG. 14 is a block diagram illustrating an apparatus for manufacturing a display device according to embodiments.

FIG. 14 is a block diagram illustrating an apparatus 50 for manufacturing a display device that is used in the process of manufacturing the display device 2 according to each embodiment described above.

The apparatus 50 for manufacturing a display device includes a controller 52 and a film formation apparatus 54. The controller 52 controls the film formation apparatus 54. The film formation apparatus 54 forms each layer of the display device 2.

Supplement

A display device according to Aspect 1 is a display device including a TFT layer including a metal layer and a protection layer protecting the metal layer in a layer above the metal layer, and a light-emitting layer, in which the metal layer and the protection layer are formed to match each other.

According to Aspect 2, the protection layer covers an end face of the metal layer.

According to Aspect 3, the protection layer and the metal layer are in contact with each other.

According to Aspect 4, a material of the protection layer is an inorganic insulating material.

According to Aspect 5, a material of the protection layer is a metal material or a metal oxide of a conductor.

According to Aspect 6, the TFT layer includes a semiconductor layer, a first inorganic layer, a first metal layer, the protection layer, and a flattening film in order from a bottom layer, and the first metal layer is the metal layer.

According to Aspect 7, the TFT layer includes a semiconductor layer, a first inorganic layer, a first metal layer, a second inorganic layer, a second metal layer, the protection layer, and a flattening film in order from a bottom layer, and the second metal layer is the metal layer.

According to Aspect 8, the display device further includes a display region including a plurality of display pixels and a frame region surrounding the display region are, and a data signal line and a high power supply voltage line in the display region are in the same layer as the second metal layer and are formed using the same material as the second metal layer.

According to Aspect 9, the display device further includes a sealing layer including a first inorganic sealing film, an organic sealing film, and a second inorganic sealing film in a layer above the light-emitting layer in order from a bottom layer, in which slits are formed at portions of the flattening film located in the frame region to surround the display region, a peripheral end edge of the organic sealing film overlaps the slits, and the display device further includes a plurality of lead wiring lines that are in the same layer as the second metal layer and are formed using the same material as that of the second metal layer, the plurality of lead wiring lines intersecting the slits.

According to Aspect 10, the plurality of lead wiring lines are electrically connected to the data signal line disposed in the display region.

According to Aspect 11, the TFT layer includes a semiconductor layer, a first inorganic layer, a first metal layer, a second inorganic layer, a second metal layer, the protection layer, and a flattening film in order from a bottom layer, the second metal layer is the metal layer, the protection layer covers an end face of the second metal layer, the display device further includes a display region including a plurality of subpixels and a frame region surrounding the display region, at least one terminal portion is included in the frame region, the terminal portion includes a terminal metal layer that is in the same layer as the second metal layer and is electrically connected to a flexible printed circuit board through an ACF, and the ACF is electrically conductive to the terminal metal layer.

According to Aspect 12, the TFT layer includes a semiconductor layer, a first inorganic layer, a first metal layer, a second inorganic layer, a second metal layer, and a flattening film in order from a bottom layer and further includes a third inorganic layer, a third metal layer, and the protection layer in order from below between the first metal layer and the second inorganic layer, and the third metal layer is the metal layer.

According to Aspect 13, the metal layer is formed by layering a plurality of metals.

According to Aspect 14, the metal layer includes an Al layer containing Al.

According to Aspect 15, the metal layer includes two Ti layers containing Ti and the Al layer disposed between the two Ti layers.

A manufacturing method for a display device according to Aspect 16 is a manufacturing method for a display device including a TFT layer including a metal layer and a protection layer protecting the metal layer in a layer above the metal layer, and a light-emitting layer, the method including: a metal layer formation process of forming the metal layer by using a mask, and a protection layer formation process of forming the protection layer by using a mask having the same pattern as the mask following the metal layer formation process.

According to Aspect 17, in the protection layer formation process, the protection layer is formed at a position covering at least an end face of the metal layer.

According to Aspect 18, in the metal layer formation process, the metal layer is formed by performing etching using the mask.

According to Aspect 19, the manufacturing method further includes a re-etching process of removing residue of the metal layer in the metal layer formation process following the protection layer formation process.

An apparatus for manufacturing a display device according to Aspect 20 is an apparatus for manufacturing a display device including a TFT layer including a metal layer and a protection layer protecting the metal layer in a layer above the metal layer, and a light-emitting layer, the apparatus including a film formation apparatus configured to form the metal layer by using a mask and form the protection layer by using a mask having the same pattern as the mask following the formation of the metal layer.

The present invention is not limited to the embodiments described above, and various modifications may be made within the scope of the claims. Embodiments achieved by appropriately combining the technical approaches disclosed in each of the different embodiments also fall within the technical scope of the present invention. Moreover, novel technical features can be formed by combining the technical approaches disclosed in the embodiments.

REFERENCE SIGNS LIST

2 Display device
4 TFT layer
6 Sealing layer
15 Semiconductor layer
16 First inorganic layer
18 Third inorganic layer
20 Second inorganic layer
21 Flattening film
24 Light-emitting layer
43 Conductive layer
39 Upper face film
40 Terminal portion
44, 45 Lead wiring line
47 Trench
48 Terminal metal layer
49 ACF
50 Apparatus for manufacturing display device GE First metal layer
SH Second metal layer
CE Third metal layer
P Protection layer
SP Subpixel
DA Display region
NA Frame region
B1 First bank
B2 Second bank
FP Flexible printed circuit board
S1, S3 Ti layer
S2 Al layer
M Photomask

The invention claimed is:

1. A display device comprising:
a thin-film transistor layer comprising a display metal layer and a display protection layer protecting the display metal layer in a layer above the display metal layer, the thin-film transistor layer formed at a display region;
a terminal metal layer formed at a frame region surrounding the display region using a same material as the display metal layer; and
a terminal protection layer formed using a same material as the display protection layer,
wherein the display metal layer and the display protection layer are formed to match each other,
the terminal metal layer and the terminal protection layer are formed to match each other,
the display protection layer covers an upper face and both side faces of the display metal layer, and
the terminal protection layer covers an upper face and both side faces of the terminal metal layer,
the display metal layer and the display protection layer are formed at the display region,
the terminal metal layer and the terminal protection layer are formed at the frame region, and
a tip end face of the terminal metal layer is covered with the metal protection layer.

2. The display device according to claim 1, wherein the display protection layer and the display metal layer are in contact with each other.

3. The display device according to claim 1, wherein a first material of the display protection layer is an inorganic insulating material, and
the display metal layer is made of at least one of:
aluminum (Al), tungsten (W), molybdenum (Mo), tantalum (Ta), chromium (Cr), titanium (Ti), and copper (Cu); or
a single-layer film aluminum (Al), tungsten (W), molybdenum (Mo), tantalum (Ta), chromium (Cr), titanium (Ti), or copper (Cu); or
a layered film of aluminum (Al), tungsten (W), molybdenum (Mo), tantalum (Ta), chromium (Cr), titanium (Ti), and copper (Cu).

4. The display device according to claim 1, wherein a first material of the display protection layer is a metal material or a metal oxide of a conductor, and
the display metal layer is made of at least one of:
aluminum (Al), tungsten (W), molybdenum (Mo), tantalum (Ta), chromium (Cr), titanium (Ti), and copper (Cu); or
a single-layer film aluminum (Al), tungsten (W), molybdenum (Mo), tantalum (Ta), chromium (Cr), titanium (Ti), or copper (Cu); or
a layered film of aluminum (Al), tungsten (W), molybdenum (Mo), tantalum (Ta), chromium (Cr), titanium (Ti), and copper (Cu).

5. The display device according to claim 1, wherein the thin-film transistor layer further comprises a semiconductor layer, a first inorganic layer, the display metal layer, the display protection layer, and a flattening film in such order from a bottom layer.

6. The display device according to claim 1, wherein the thin-film transistor layer further comprises a semiconductor layer, a first inorganic layer, a first metal layer, a second inorganic layer, a second metal layer, the display protection layer, and a flattening film in such order from a bottom layer, and
the second metal layer is the display metal layer.

7. The display device according to claim 6, further comprising:
wherein a data signal line and a high-power supply voltage line in the display region are in a same layer as the second metal layer and are formed using a same material as the second metal layer.

8. The display device according to claim 7, further comprising:
a plurality of lead wiring lines; and
a sealing layer including a first inorganic sealing film, an organic sealing film, and a second inorganic sealing film in a layer above a light-emitting layer in such order from a bottom layer of the sealing layer,
wherein slits are formed at portions of the flattening film located in the frame region to surround the display region,
a peripheral end edge of the organic sealing film overlaps the slits, and
the plurality of lead wiring lines is in a same layer as the second metal layer, is formed using a same material as the second metal layer, and intersects the slits.

9. The display device according to claim 8, wherein the plurality of lead wiring lines is electrically connected to the data signal line disposed in the display region.

10. The display device according to claim 4, wherein the thin-film transistor layer further comprises a semiconductor layer, a first inorganic layer, a first metal layer, a second inorganic layer, a second metal layer, the display protection layer, and a flattening film in such order from a bottom layer, and
the second metal layer is the display metal layer.

11. The display device according to claim 1, wherein the thin-film transistor layer further comprises:
a semiconductor layer, a first inorganic layer, a first metal layer, a second inorganic layer, a second metal layer, and a flattening film in such order from a bottom layer, and
a third inorganic layer, a third metal layer, and the display protection layer in such order from a bottom layer between the first metal layer and the second inorganic layer, and
the third metal layer is the display metal layer.

12. The display device according to claim 1, wherein the display metal layer is formed by layering a plurality of metals.

13. The display device according to claim 1, wherein the display metal layer includes an aluminum (Al) layer containing Al.

14. The display device according to claim 13, wherein the display metal layer includes two titanium (Ti) layers containing Ti and the Al layer disposed between the two Ti layers.

* * * * *